United States Patent
Zimmermann et al.

(10) Patent No.: US 7,800,732 B2
(45) Date of Patent: Sep. 21, 2010

(54) PROJECTION EXPOSURE METHOD AND PROJECTION EXPOSURE APPARATUS FOR MICROLITHOGRAPHY

(75) Inventors: Joerg Zimmermann, Aalen (DE); Heiko Feldmann, Aalen (DE); Tilmann Heil, Aalen (DE); Paul Graeupner, Aalen (DE); Ulrich Gebhardt, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 12/643,637

(22) Filed: Dec. 21, 2009

(65) Prior Publication Data
US 2010/0157266 A1 Jun. 24, 2010

(30) Foreign Application Priority Data
Dec. 22, 2008 (DE) .................. 10 2008 064 504

(51) Int. Cl.
- *G03B 27/42* (2006.01)
- *G03B 27/52* (2006.01)
- *G03B 27/58* (2006.01)

(52) U.S. Cl. .............................. 355/53; 355/55; 355/72

(58) Field of Classification Search .................. 355/53, 355/72, 55
See application file for complete search history.

(56) References Cited

U.S. PATENT DOCUMENTS

| | | | |
|---|---|---|---|
| 4,937,619 A | 6/1990 | Fukuda et al. | |
| 5,883,700 A | 3/1999 | Someya | |
| 6,586,160 B2 | 7/2003 | Ho et al. | |
| 6,641,981 B1 | 11/2003 | Kaneko et al. | |
| 2007/0165202 A1 | 7/2007 | Koehler et al. | |

FOREIGN PATENT DOCUMENTS

WO WO 2005/026843 3/2005

OTHER PUBLICATIONS

Handbook of Optical Systems: vol. 2, Physical Image Formation, ed. H. Gross, Wiley-VCH Verlag GmbH & Co. KGaA, Chapter 20.2, (2005).

*Primary Examiner*—Peter B Kim
(74) *Attorney, Agent, or Firm*—Fish & Richardson P.C.

(57) ABSTRACT

A projection exposure method for the exposure of a radiation-sensitive substrate arranged in the region of an image surface of a projection objective with at least one image of a pattern of a mask arranged in the region of an object surface of the projection objective includes exposing the substrate with the image of the pattern in an effective image field of the projection objective during an exposure time interval and also altering a relative positioning between a surface of the substrate and a focus surface of the projection objective during the exposure time interval in such a way that image points in the effective image field are exposed with different focus positions of the image of the mask during the exposure time interval. An active compensation of at least one portion of at least one imaging aberration induced by the change in the focus positions during the exposure time interval has the effect that the imaging quality is not significantly impaired by the alteration of the focusing during the exposure time interval.

21 Claims, 4 Drawing Sheets

PROJECTION EXPOSURE METHOD AND PROJECTION EXPOSURE APPARATUS FOR MICROLITHOGRAPHY

CROSS-REFERENCE TO RELATED APPLICATIONS

This application claims priority under 35 U.S.C. §119(e)(1) to German Application No. 10 2008 064 504.4 filed Dec. 22, 2008. The contents of both of this application is hereby incorporated by reference in its entirety.

BACKGROUND

The disclosure relates to a projection exposure method for the exposure of a radiation-sensitive substrate arranged in the region of an image surface of a projection objective with at least one image of a pattern of a mask arranged in the region of an object surface of the projection objective, and to a projection exposure apparatus suitable for carrying out the method.

Microlithographic projection exposure methods are predominantly used nowadays for producing semiconductor components and other finely patterned components. These methods involve the use of masks (reticles), that bear the pattern of a structure to be imaged, e.g., a line pattern of a layer of a semiconductor component. A mask is positioned into a projection exposure apparatus between an illumination system and a projection objective in the region of the object surface of the projection objective and is illuminated with an illumination radiation provided by the illumination system. The radiation altered by the mask and the pattern passes as projection radiation through the projection objective, which images the pattern of the mask onto the substrate to be exposed, which normally bears a radiation-sensitive layer (photoresist).

There are various possibilities for transferring the image of a pattern of a mask to the substrate. In one variant, the entire pattern is positioned in the effective object field of the projection objective and imaged onto the substrate in an exposure extending over an exposure time interval, the mask and the substrate not moving during the exposure time interval. Corresponding projection exposure apparatuses are generally referred to as wafer steppers. In some systems, different regions of the pattern to be transferred are transferred to the substrate temporally successively. For this purpose, a scanning operation is carried out during an illumination time interval, said scanning operation involving the movement of the mask in the object surface relative to the effective object field of the projection objective, while the substrate is moved synchronously with the movement of the mask in the region of the image surface relative to the effective image field of the projection objective. The movement speed of the mask in the scanning direction thereof is linked to the movement speed of the substrate in the scanning direction thereof by the magnification ratio $\beta$ of the projection objective, which is less than 1 in the case of reducing objectives. Projection exposure apparatuses designed for such scanning operations are generally referred to as wafer scanners.

In order that an image of the pattern that is as faithful to the original as possible is transferred to the substrate during the exposure process, the substrate surface should lie in the image-side focal range of the projection objective during the exposure time interval. In particular, the substrate surface should lie in the range of the depth of focus (DOF) of the projection objective, which is proportional to the Rayleigh unit RU, which is defined as $RU=\lambda/NA^2$, the $\lambda$ is the operating wavelength of the projection exposure apparatus and NA is the image-side numerical aperture of the projection objective. Lithography in the deep ultraviolet (DUV) range at $\lambda=193$ nm commonly utilizes, for example, projection objectives having image-side numerical apertures of 0.75 or greater in order to produce structure elements having typical sizes of 0.2 µm or less. In this NA range, the depth of focus is typically a few tenths of a micrometer. In general, the depth of focus becomes smaller, the higher the resolving power of the projection objective.

Lithography processes with a relatively large depth of focus are used for some applications. Large depths of focus are desired for example in the production of patterned semiconductor components for logic applications in order to produce SRAM cells, random contact holes or contact holes through pitch, for example. Large depths of focus can also be advantageous in so-called double patterning methods. In a double patterning method (or double-exposure method), a substrate, for example a semiconductor wafer, is exposed twice in succession and the photoresist is then processed further. In a first exposure process, a normal structure having a suitable structure width is projected. For a second exposure process, a second mask is used, which has a different mask structure. In particular, the structures of the second mask can be displaced by half a period relative to the structures of the first mask. In the general case, the differences between the layouts of the two masks can be large, particularly in the case of more complex structures. A reduction of the structure sizes that can be obtained at the substrate can be achieved by double patterning.

One possibility for enlarging the effective depth of focus is so-called "focus drilling". Focus drilling involves altering the relative positioning of the surface of the substrate with respect to the focus surface of the projection objective during the exposure time interval in such a way that image points in the effective image field are exposed with different focus positions of the image of the mask during the exposure time interval.

This can be achieved for example by altering the operating wavelength of the light source that is used for imaging, thus resulting in different focus positions at the image side of the projection objective. It is also possible to use a projection objective containing one or more adjustable optical elements, such that it is possible to alter the focal length of the projection objective for the focus drilling. The focus drilling can then be achieved by modulating the focal length of the projection objective during the exposure time interval. These possibilities of focus drilling can be used for wafer steppers and for wafer scanners.

In the case of wafer scanners it is also possible to achieve focus drilling by tilting the substrate during the exposure time interval relative to the projection objective in a tilting direction about a tilting axis in such a way that the substrate normal is inclined by a finite tilting angle with respect to the optical axis of the projection objective in the region of the image plane. Together with a scanning movement of the substrate that proceeds parallel to the tilting direction, this leads, at each image point, to the superimposition of a multiplicity of aerial images at different focus positions, whereby the depth of focus of the process is effectively enlarged. Although the enlargement of the depth of focus that is achieved in this way is generally accompanied by a certain reduction of contrast, overall a more favourable process window and hence added value for the user can be produced.

SUMMARY

The disclosure features a projection exposure method with focus drilling which enables an improved imaging quality by comparison of conventional methods. The disclosure also features a projection exposure apparatus suitable for carrying out the projection exposure method.

In one aspect, the invention features a method including exposing a substrate with an image of a pattern in an effective image field of a projection objective during an exposure time interval. Said effective image field is optically conjugate with respect to an effective object field of the projection objective in which the pattern or part of the pattern is situated. During the exposure time interval, the relative positioning between that surface of the substrate which serves as the light entrance surface and the focus surface of the projection objective is altered in such a way that the image points in the effective image field are exposed with different focus positions of the image of the mask during the exposure time interval. Focus drilling therefore takes place. The quality of the imaging can be improved by an active compensation of at least one portion of at least one imaging aberration induced by the change in the focus positions during the exposure time interval.

The inventors have recognised that, by way of example, on account of telecentricity errors from the illumination system and/or from the projection objective, there may be undesirable side effects which, although they do not disturb the imaging quality of an exposure process during normal operation in the region of best focus, can have a non-negligible disadvantageous influence on the imaging quality at large defocus settings. The active compensation of at least one portion of the imaging aberrations induced by the change in the focus positions has the effect that, in comparison with systems without such active compensation, the imaging aberrations affect the product produced to a lesser extent, the quality of which product can thus be improved.

Focus drilling, in many cases, causes distortion-like aberrations which can dominate the aberration budget. Therefore certain embodiments provide for the active compensation to include an alteration of distortion aberrations of the projection objective during the illumination time interval, said alteration being coordinated with the alteration of the relative positioning.

Adverse influences of focus drilling on the imaging behaviour of the projection exposure apparatus can occur in wafer scanners or in wafer steppers. They can be particularly disturbing in scanner systems wherein a scanning operation is carried out during the illumination time interval, said scanning operation involving the movement of the mask in the object surface relative to an effective object field and the substrate in the region of the image surface relative to the effective image field of the projection objective synchronously in respective scanning directions.

In scanner systems focus drilling can be achieved without alterations at the projection objective and/or at the light source. For example, the substrate can be tilted during the exposure time interval relative to the projection objective in a tilting direction about a tilting axis in such a way that a substrate normal is inclined by a finite tilting angle with respect to an optical axis of the projection objective in the region of the image plane. The tilting direction corresponds to the scanning direction of the substrate; the tilting axis is perpendicular thereto. In this case it may be provided that the alteration of the distortion parameters of the projection objective includes a change in the distortion parallel to the tilting direction. If the distortion aberration has a profile perpendicular to the tilting direction, then the alteration of the distortion parameters can include a profile of a distortion aberration perpendicular to the tilting direction in order to make the aberration more uniform in this direction. In this case, it is possible, in particular, to generate a quadratic profile of the function in a direction parallel to the tilting axis.

The active compensation of at least one portion of imaging aberrations that are induced by change in the focus positions during an exposure time interval can advantageously be achieved using a targeted alteration of the imaging properties of the projection objective during the exposure time interval. A correspondingly configured compensation system can accordingly include at least one manipulator for manipulating at least one optical element of the projection objective and also a manipulator control unit for controlling the manipulator, the manipulator control unit and the manipulator being configured such that it is possible to obtain an active compensation of at least one portion of at least one imaging aberration induced by the change in the focus position during the exposure time interval.

A manipulator can be configured to bring about a rigid body movement of at least one optical element relative to other optical elements, for example a displacement in the direction of the optical axis (z-manipulator), a displacement perpendicular to the optical axis (x/y manipulator) and/or a tilting. The manipulation can also involve targeted deformations of selected optical elements, e.g., a deformation of a mirror, of a lens or of a transparent plane plate.

The control signals for driving a manipulator can be generated on the basis of predefined values that are stored in a memory of the compensation system in the manner of a look-up table. It is also possible for the control signals used for the movements of a manipulator to be calculated from case to case, e.g., on the basis of measured values. The input values for determining control signals for driving a manipulator can be obtained e.g., from information about the extent of the tilting or with the aid of sensors that detect distortion aberrations, wavefront aberrations and/or other properties suitable for characterising the imaging quality.

In general, in another aspect, the invention features a projection exposure apparatus whose components are configured or designed for carrying out the method. In particular, in certain aspects, the invention features a projection exposure apparatus for the exposure of a radiation-sensitive substrate arranged in the region of an image surface of a projection objective with at least one image of a pattern of a mask arranged in the region of an object surface of the projection objective, including a primary radiation source for emitting primary radiation; an illumination system for receiving the primary radiation and for generating an illumination radiation directed onto the mask; a projection objective for generating an image of the pattern in the region of the image surface of the projection objective; devices for altering a relative positioning between a surface of the substrate and a focus surface of the projection objective during an exposure time interval in such a way that image points in the effective image field are exposed with different focus positions of the image of the mask during the exposure time interval; and a compensation system for the active compensation of at least one portion of at least one imaging aberration induced by the change in the focus positions during the exposure time interval.

Other features are in the description, drawings, and claims. Various individual features can be realised in each case by themselves or as a plurality in the form of subcombinations.

Exemplary embodiments are illustrated in the drawings and are explained in closer detail below.

DETAILED DESCRIPTION

Figure 1:
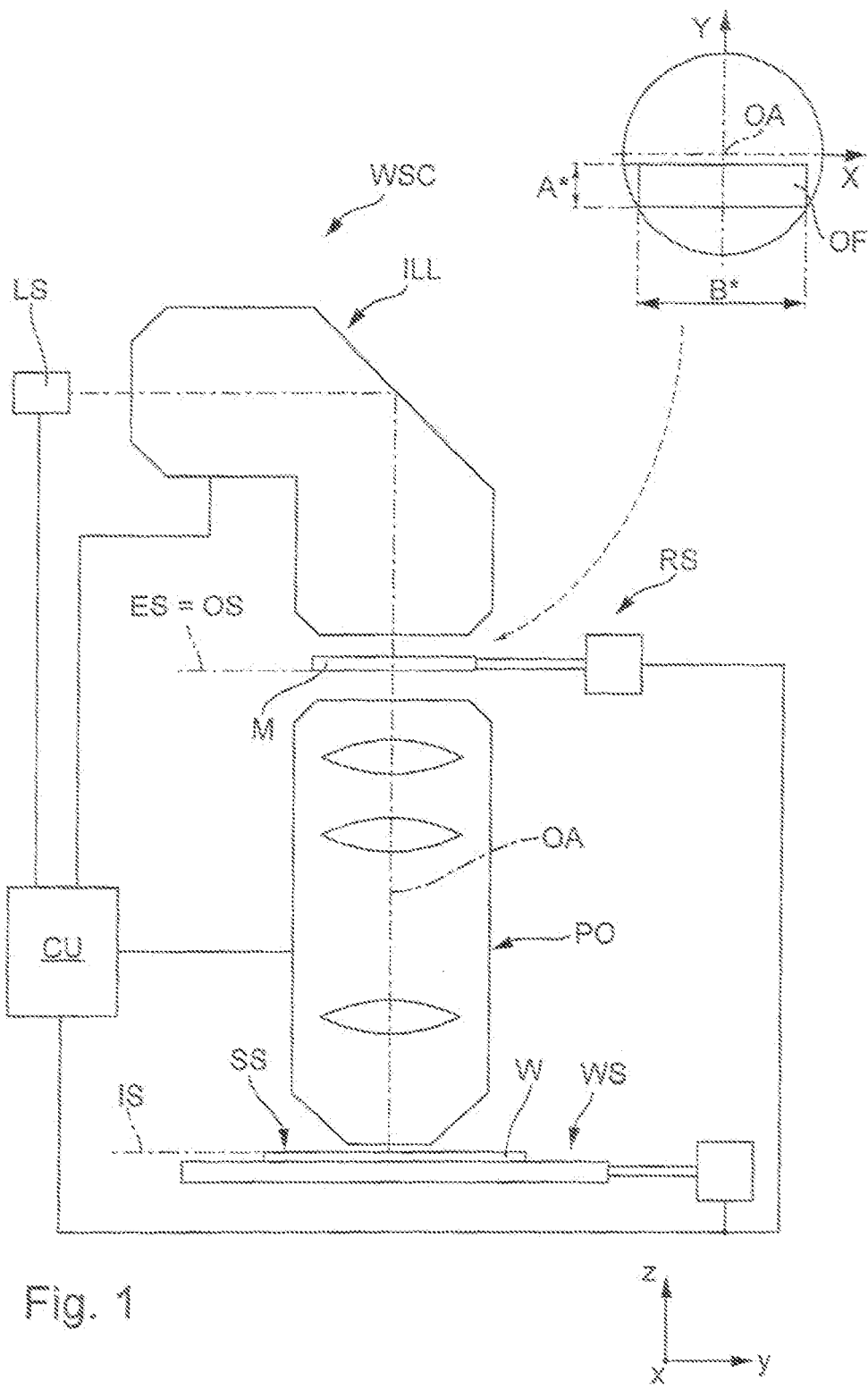
FIG. 1 schematically shows the construction of a projection exposure apparatus for microlithography.
Figure 2:
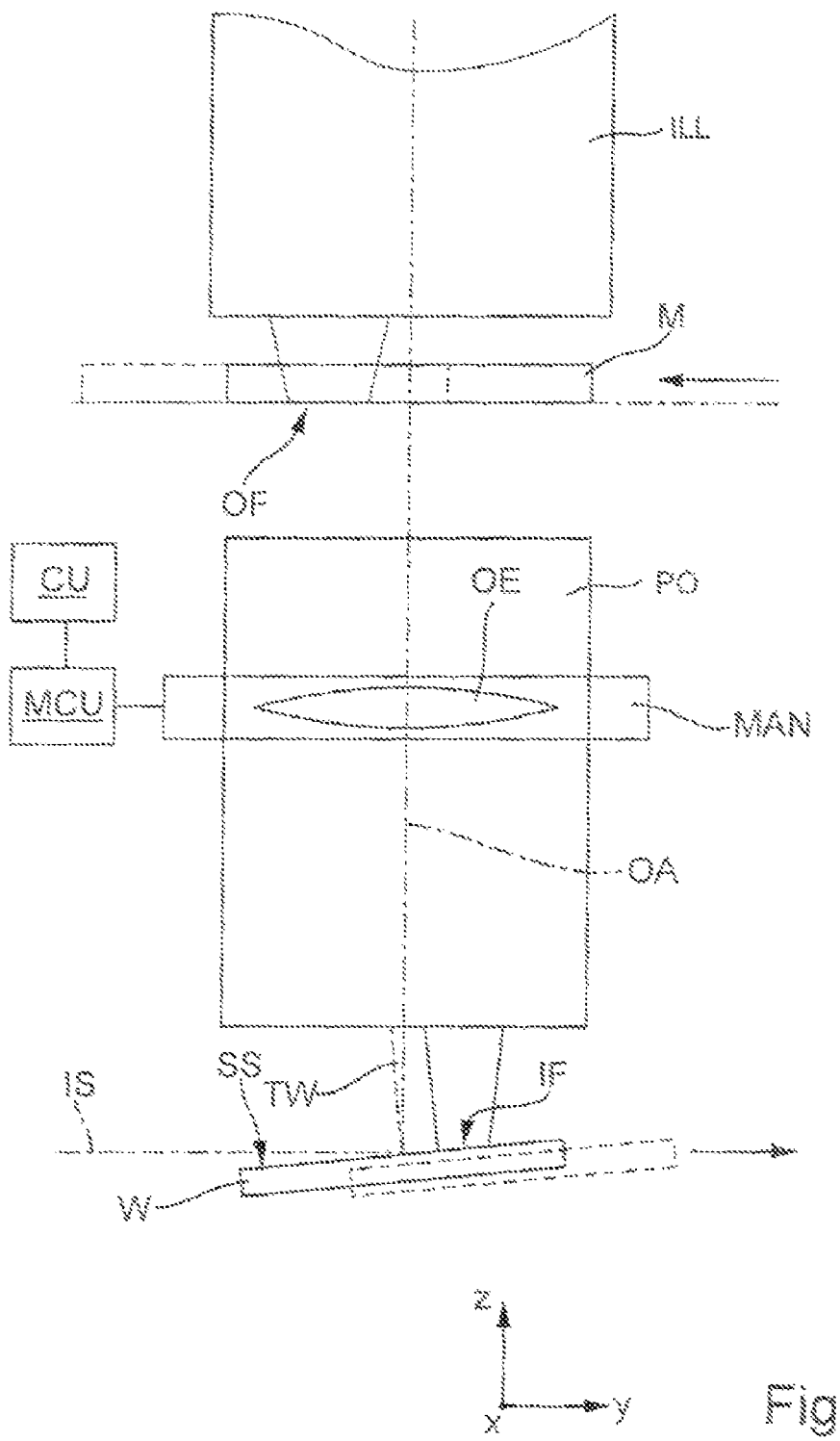
FIG. 2 schematically shows the focus drilling with a tilted substrate moved in the scanning direction in a projection exposure apparatus for microlithography.

FIG. 1 shows an example of a microlithography projection exposure apparatus WSC which can be used in the production of semiconductor components and other finely patterned components and operates with light or electromagnetic radiation from the deep ultraviolet range (DUV) in order to obtain resolutions down to fractions of micrometers. An ArF excimer laser having an operating wavelength λ of approximately 193 nm serves as a primary light source LS. Other UV laser light sources, for example $F_2$ lasers having an operating wavelength of 157 nm, or ArF excimer lasers having an operating wavelength of 248 nm, are likewise possible.

In the case of projection exposure apparatuses having exclusively reflective subsystems, it is also possible to use radiation sources which emit in the extreme ultraviolet range (EUV).

An illumination system ILL disposed downstream of the light source LS generates in its exit surface ES a large, sharply delimited and substantially homogeneously illuminated illumination field that is adapted to the telecentricity requirements of the projection objective PO arranged downstream in the light path. The illumination system ILL has devices for setting different illumination modes (illumination settings) and can be changed over for example between conventional on-axis illumination with varying degree of coherence a and off-axis illumination, wherein the off-axis illumination modes includes for example an annular illumination or a dipole illumination or a quadrupole illumination or some other multipolar illumination. The construction of suitable illumination systems is known per se and is therefore not explained in greater detail here. The patent application US 2007/0165202 A1 (corresponding to WO 2005/026843 A2), discloses examples of illumination systems which can be used in the context of various embodiments.

Those optical components which receive the light from the laser LS and shape illumination radiation from the light, said illumination radiation being directed onto the reticle M, belong to the illumination system ILL of the projection exposure apparatus.

A device RS for holding and manipulating the mask M (reticle) is arranged downstream of the illumination system such that the pattern arranged at the reticle lies in the object plane OS of the projection objective PO, which coincides with the exit plane ES of the illumination system and is also referred to here as reticle plane OS. The mask is movable in this plane for scanner operation in a scanning direction (y-direction) perpendicular to the optical axis OA (z-direction), with the aid of a scanning drive.

Downstream of the reticle plane OS there follows the projection objective PO, which acts as a reducing objective and by which an image of the pattern arranged at the mask M is imaged at a reduced scale, for example at the scale 1:4 (/1β/=0.25) or 1:5 (/β/=0.20) onto a substrate W covered with a photoresist layer, the light-sensitive substrate surface SS of said substrate lying in the region of the image plane IS of the projection objective PO. Refractive, catadioptric or catoptric (e.g. for EUV) projection objectives are possible. Other reduction scales, for example greater demagnifications up to 1:20 or 1:200, are possible.

The substrate to be exposed, which is a semiconductor wafer W in the case of the example is held by a device WS comprising a scanner drive for moving the wafer synchronously with the reticle M perpendicular to the optical axis OA in a scanning direction (y-direction). Depending on the design of the projection objective PO (e.g. refractive, catadioptric or catoptric, without intermediate image or with intermediate image, folded or unfolded), these movements of mask and substrate can be effected parallel or antiparallel to one another. The device WS, also referred to as "wafer stage", and the device RS, also referred to as "reticle stage", are part of a scanner device which is controlled by means of a scanning control device which, in the embodiment, is integrated into the central control device CU of the projection exposure apparatus.

As shown schematically in the inset figure with respect to FIG. 1, the illumination system ILL generates in its exit plane, in which the pattern the mask is situated during operation of the projection exposure apparatus, a sharply delimited, rectangular illumination field, the form and size of which determines the form and size of the effective object field OF of the projection objective that is used during the projection exposure. In other embodiments, the slot-shaped illumination field can also be curved. The effective object field contains all those object field points of the object surface which are intended to be imaged onto the substrate in the given process. The effective object field has a length A* parallel to the scanning direction and a width B*>A* in a cross-scan direction perpendicular to the scanning direction. In the case of the example, the effective object field is arranged completely outside the optical axis of the projection objective at a distance from the latter (off-axis field). During imaging, the object field points of the effective object field are imaged into the effective image field which is optically conjugate with respect to the effective object field and which is reduced in size relative to the effective object field by the imaging scale of the projection objective but has the same rectangular form with the same aspect ratio A/B=A*/B* as the effective object field.

The projection objective PO can have a multiplicity of schematically indicated lenses (typical number of lenses is often more than 10 or more than 15 lenses) and, if appropriate, other transparent or reflective optical components. The projection objective can be a purely refractive (dioptric) projection objective. The projection objective can additionally also contain at least one curved mirror, in particular at least one concave mirror, such that a catadioptric projection objective is present. Pure mirror systems (catoptric systems) are likewise possible.

The projection exposure apparatus is designed to change the relative positioning between the surface SS of the substrate and the focal range of the projection objective PO during an exposure time interval in such a way that image points in the effective image field IF are exposed with different focus positions of the image of the mask during the exposure time interval. As a result, with the aid of the focus drilling technique, it is possible to carry out a lithography process with an effective depth of focus which is greater than the nominal depth of focus of the projection objective, which is proportional to the Rayleigh unit $RU=\lambda/NA^2$.

The larger the image-side numerical aperture NA of the projection objective, the smaller the depth of focus, such that focus drilling is generally needed principally in high-aperture projection objectives, for example where $NA \geq 0.8$ or $NA \geq 0.9$. In particular, the focus drilling can be beneficial with the use of immersion systems wherein image-side numerical apertures $NA \geq 1$ are possible, for example $NA \geq 1.1$ or $NA \geq 1.2$ or $NA \geq 1.3$ or $NA \geq 1.4$. Typical depths of focus in applications with focus drilling are often in the range between 50 nm and 200 nm With high-aperture projection systems of this type, it is possible to obtain, depending on wavelength and process parameters, typical structure sizes of significantly less than 100 nm, for example with structure sizes of 80 nm or less, or 65 nm or less, or 45 nm or less, or 32 nm or less, or 22 nm or less.

The device WS for holding and moving the substrate W has an integrated tilting device in order to tilt the substrate prior to the exposure in a tilting direction, which runs parallel to the scanning direction, about a tilting axis running perpendicular thereto (in the x-direction) in such a way that the substrate normal SN is inclined by a finite tilting angle TW with respect to the optical axis OA of the projection objective in the region of the image plane IS. Typical tilting angles can be e.g. in the range of 0.01 mrad to 0.2 mrad. This tilting in the y-direction (substrate normal lies in a y-z plane) produces, together with the scanning movement proceeding parallel to the y-direction, a superimposition of a multiplicity of aerial images at different focus positions, which is referred to here as focus drilling.

The projection objective PO contains at least one manipulator MAN for manipulating at least one manipulable optical element OE of the projection objective, and also a manipulator control unit MCU for controlling the manipulator, said manipulator control unit being connected to the central control device CU or being integrated into the latter. With the aid of the manipulator it is possible, by means of action on one or a plurality of manipulable optical elements, to alter the imaging capability of the projection objective by altering the wavefront aberrations produced by the projection objective in a targeted manner. In the case of the example, the manipulator is constructed in such a way that it is possible to alter components of the distortion aberration parallel to the scanning direction, that is to say parallel to the y-direction, in a targeted manner by means of the manipulator.

Figure 3:
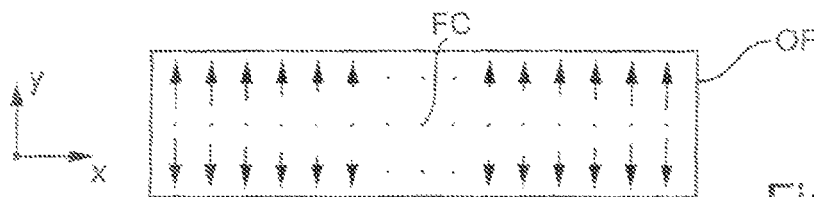
FIG. 3 schematically shows a profile of the illumination telecentricity residual error over the effective object field illuminated by the illumination system at the mask.

A problem which can occur e.g. during focus drilling in a wafer scanner with a tilted substrate will now be explained with reference to FIGS. 3 to 7. Illumination systems and projection objectives for microlithography-projection exposure apparatuses, like all real optical systems, are not totally free of residual aberrations, but rather are corrected in such a way that the relevant aberrations remain below application-specific limit values. In the case of the example, the illumination system has a telecentricity residual error, inter alia. FIG. 3 shows an example of a profile of the illumination telecentricity residual error over the effective object field of illuminated by the illumination system at the mask. The arrows indicate the direction of the telecentricity error and the length of the arrows indicates the extent (or the absolute value) of the telecentricity error for a number of selected field points. It can be discerned that there is a residual telecentricity error in the y-direction. The telecentricity residual error vanishes in the centre of the field (field centre FC), and in the y-direction there arises an antisymmetrical profile with opposite signs of the telecentricity error in the case of positive and in the case of negative y-positions relative to the field centre. In the cross-scan direction (x-direction) running perpendicular to the y-direction (scanning direction), there arises approximately a quadratic profile, the extent of the telecentricity error increasing towards the field edges in the x-direction approximately in accordance with a parabolic function.

Figure 4:
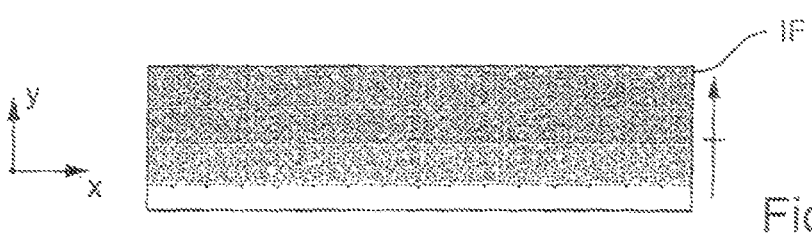
FIG. 4 schematically shows the defocus profile during focus drilling in the effective image field IF.

FIG. 4 schematically shows the defocus profile during focus drilling in the effective image field IF. The focus drilling produces a linear defocus profile with large defocus absolute values along the scanning direction (y-direction) over the illuminated field at the wafer. In the exemplary system, the extent of the variation of the defocus is determined by the size of the tilting angle TW and the length A* of the effective object field. In general, the defocus is greatest in terms of absolute value at the start and at the end of the scanning movement, although the defocus has different signs.

Figure 5:
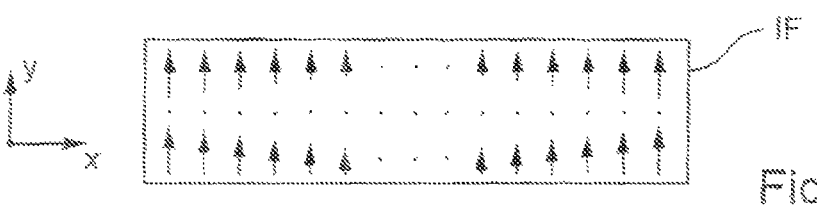
FIG. 5 schematically shows the location dependence of the induced overlay error in the effective image field IF.

The telecentricity error introduced into the imaging by the illumination system leads, in conjunction with the change in the focus position during scanning, to an overlay error (image placement error) which scales substantially proportionally with the extent of the defocus and with the extent of the telecentricity error. FIG. 5 schematically shows the location dependence of the overlay error in the effective image field IF, the arrows representing direction and absolute value of the overlay error. In the case of the example, image displacements in the positive y-direction arise both for positive and for negative y-positions (relative to the field centre). No displacement arises in the region of the field centre (around y=0). The quadratic profile of the extent of the displacement, this quadratic profile stemming from the profile of the telecentricity error, arises in the x-direction.

The scanning operation, that is to say the scanning in the y-direction, leads to the averaging of the effects shown in FIG. 5 for all y-positions. An averaged overlay error illustrated schematically in FIG. 6 arises as a result, this averaged overlay error being constant within the scanning field in the y-direction and having a quadratic profile here with respect to the x-axis, that is to say increasing parabolically outwards on both sides of the centre.

Figure 6:
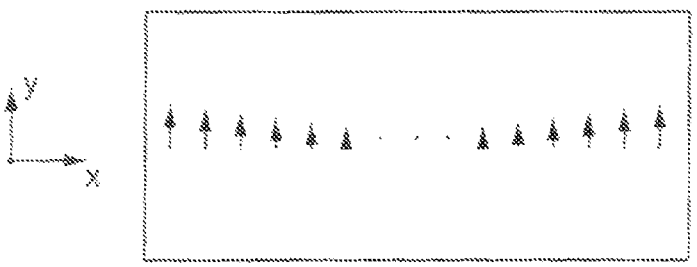
FIG. 6 schematically shows averaged overlay errors produced from the errors shown in FIG. 5 by scanning in the y-direction.
Figure 7A:
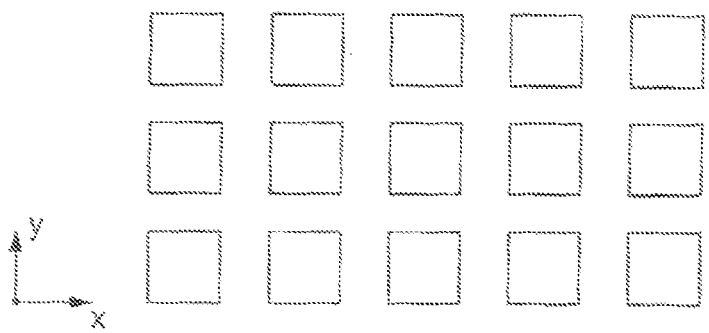
FIG. 7 shows in 7A an imaged pattern without overlay error and in 7B how the overlay error illustrated schematically in FIG. 6 affects a pattern to be imaged.
Figure 7B:
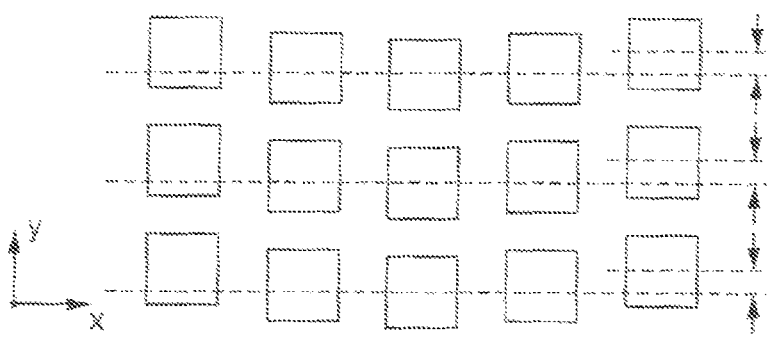

FIG. 7 schematically shows how the overlay error illustrated schematically in FIG. 6 affects a pattern to be imaged. For this purpose, FIG. 7A shows an example of imaged structures on a substrate in an ideal system without overlay errors. The dark squares can represent contact holes, for example. If an overlay error occurs on account of the telecentricity residual error in conjunction with the focus drilling, then the structure may appear for instance as shown in FIG. 7B, with an overlay error in the y-direction that is dependent on the position in the x-direction. In other words, the extent of the overlay error is vanishingly small at and near the field centre viewed in the x-direction, while the overlay error leads to a relative displacement of the imaged structure relative to the ideal positions in the y-direction, the extent of the displacement in the x-direction having an approximately quadratic profile.

In the projection exposure apparatus, these overlay errors are actively compensated for, such that they do not occur or occur only to a significantly smaller extent. The compensation system provided for this purpose permits a displacement of the imaged structures by means of a setting of specific wavefront aberrations of the projection objective with the aid of at least one manipulator MAN which acts on at least one optical element of the projection objective in such a way that an alteration of a wavefront aberration is produced which partly or completely compensates for the displacement of the structure. In the example illustrated, the displacement of the imaged structures in the y-direction is compensated for by setting a Zernike Z3 wavefront aberration. Specifically, the overlay profile that is quadratic in the x-direction is compensated for by setting a quadratic wave profile of a Z3 wavefront aberration. The manipulator MAN is correspondingly designed and positioned for producing such Z3 wavefront aberrations or altering the absolute value thereof in a targeted manner.

As is known, wavefront aberrations which are caused in the optical system and/or are induced by external influences can be described as linear combinations of polynomials. In the field of optics, there are various polynomial descriptions for aberrations, for example the Seidel polynomials or the Zernike polynomials. In this application, Zernike polynomials are used to represent wavefronts which in turn describe specific imaging aberrations of optical systems. By way of example, aberrations such as defocus, astigmatism, distortion, coma, spherical aberration, etc. up to higher orders can be described by Zernike polynomials. An aberration can be represented as a linear combination of a selected number of Zernike polynomials. Zernike polynomials form a set of complete orthogonal polynomials which are defined on a unit circle. Polar coordinates are generally used, for example $\rho$ for the normalized radius and $\theta$ for the azimuth angle (angle in the circumferential direction). A wavefront aberration $W(\rho,\theta)$ can be expanded into Zernike polynomials as a sum of products of Zernike terms and corresponding weight factors (see e.g. Handbook of Optical Systems: Vol. 2, Physical Image Formation, ed. H. Gross, Wiley-VCH Verlag GmbH & Co. KGaA, chapter 20.2, (2005)). In a Zernike representation, the Zernike polynomials Z1, Z2, Z3, etc. have specific meanings which represent corresponding contributions to a total aberration. By way of example, $Z1=1$ corresponds to a constant term (cylinder term), $Z2=\rho \cos\theta$ corresponds to a distortion in the x-direction, $Z3=\rho \sin\theta$ corresponds to a distortion in the y-direction, $Z4=2\rho^2-1$ corresponds to the parabolic part of a defocus, $Z5=\rho^2 \cos 2\theta$ corresponds to a third-order astigmatism, etc.

Zernike polynomials can also be used to describe deviations of an optical surface, for example of a lens surface or mirror surface, from a standard surface, for example from a spherical standard surface.

For the exemplary case of a distortion in the y-direction, it should be taken into consideration that the relationship between the Z3 absolute value and the image displacement in the y-direction is linear. The linear relationship arises from the equation: $\Delta y=Z3*\lambda/NA$, where $\Delta y$ is the image displacement in the y-direction, $\lambda$ is the wavelength, NA is the image-side numerical aperture of the projection objective, and Z3 is the coefficient of the Zernike polynomial Z3. The definition of the Zernike polynomial Z3 in fringe normalization is used here, namely $Z3=\rho \sin\theta$ with the pupil coordinates $\rho$ and $\theta$. This relationship is applicable independently of the illumination distribution used and also independently of the pattern to be imaged.

For higher-order aberrations which likewise bring about image displacements, for example Z8, Z15, Z24 etc., the relationship between Zernike coefficient and image displacement is likewise linear, but the proportionality factor is dependent on the illumination distribution and on the pattern to be imaged. The relationship is therefore generally determined by simulation. For practical application this means, inter alia, that possible structure-dependent overlay errors can also be compensated for by including higher Zernike orders, for example Z8, Z15, Z24, etc., in the manipulation of one or more optical elements in the projection objective.

These relationships are used as follows in the embodiment described. As described, the projection exposure apparatus is designed for scanning operation with a tilted substrate in order to obtain focus drilling in this way. For this purpose, the desired tilting angle for the substrate or a related variable, for example the desired focus scanning range, can be predefined at the control unit CU. These specifications are used to calculate the magnitude of the wavefront aberration which would compensate for the distortion aberrations that are to be expected on account of the focus drilling. The wavefront aberration is intended to produce essentially an image displacement opposite and equal to the focus drilling. Corresponding values can be stored in the controller for example in the form of a look-up table. On the basis of this specification, control signals are determined for one or more manipulators, which are then driven correspondingly in order to produce in the exemplary case the field profiles in the x-direction from 1st-order wavefront aberrations in the y-direction (Z3 and also higher orders Z8, Z15, Z24, etc.).

Figure 8:
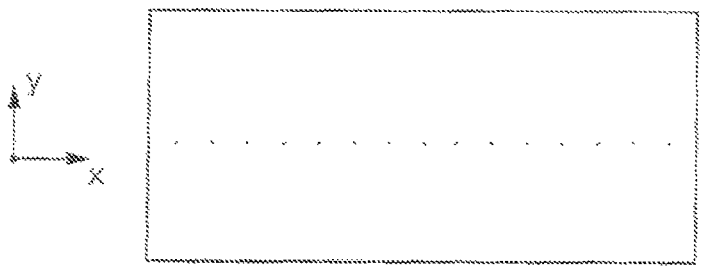
FIG. 8 schematically shows the absence of image displacements in scanning operation after compensation by a wavefront aberration that is dependent on the x-position and is introduced with the aid of a Z3 manipulator.

The result that can be obtained is illustrated schematically in FIG. 8. Analogously to FIG. 7, this illustration shows the image displacement during scanning operation after compensation by the wavefront aberration dependent on the x-position. The absence of arrows indicating the direction and magnitude of the image displacement is intended to indicate that the compensation is effective for the entire width of the image field. A projection exposure with compensation switched on would produce correspondingly imaged structures without overlay errors, as are illustrated by way of example in FIG. 7A.

A quantification of achievable aberration corrections is described below on the basis of a catadioptric projection objective which is shown in FIG. 3 in the patent application US 2008/0174858 A1 in the name of the Applicant and is described in detail in connection with said figure. The disclosure in this regard in said document is incorporated by reference in the content of the present description. In a simulation, this projection objective was operated in a method with focus drilling, which was produced by tilting a substrate in conjunction with a scanning movement of the substrate. The parameters of the focus drilling simulation were chosen such that a profile of the overlay error over the field arose in a manner similar to that shown in FIG. 5, which, as a result of the averaging effect during the scanning operation, led to an averaged overlay error in accordance with FIG. 6 which had a maximum value of 10 nm at the edges in the x-direction and a value of 0 in the field centre.

For compensation purposes, a group of manipulators was activated in order to displace the lenses 1, 4, 7, 13, 14, 16 and 20 (viewed in the direction of transmission from the object plane to the image plane) parallel to the optical axis, that is to say in the z-direction, and also to tilt them. In this way, the original disturbance was able to be reduced approximately by a factor of 20 from the maximum value 10 nm to a maximum value of approximately 0.5 nm.

In a further simulation, another group of manipulators was activated in order to displace the lenses 7, 9, 10 and 14 parallel to the optical axis and to simultaneously tilt them. In addition, the lenses 1 and 6 were subjected to second-order deformation. As a result, the aberration was able to be reduced even more extensively, to be precise from originally 10 nm to approximately 0.08 nm.

These examples clearly show the great potential of the method for the compensation of at least one portion of imaging aberrations which may arise as a result of change in the focus positions during an exposure time interval, that is to say during focus drilling.

Important aspects of the invention have been explained here by way of example on the basis of a wafer scanner wherein focus drilling is brought about by a tilting of the substrate to be exposed which, in combination with the scanning movement, leads to the directory-like imaging aberrations which bring about an overlay error. The invention is not restricted to such systems. Focus drilling is also possible by changing the focal length of a projection objective with the aid of adjustable optical elements (manipulators). In this case, the distortion-like imaging aberrations described can occur if the temporal modulation of a defocusing is not effected completely synchronously with the scanning movement. In the case of deviations from synchronicity, an averaged defocus that differs from the value 0 can arise at the exposed substrate, and possible telecentricity errors from the illumination systems and/or projection objectives can translate into overlay errors for the imaged structures. Compensation would be possible analogously to the exemplary embodiments described by setting a predefinable aberration profile, in which case the aberration profile could for example substantially correspond to a Z3 with a field profile corresponding to the field profile of a possible telecentricity error, the aberration profile introduced for compensation purposes also being temporally modulated. In the case of wafer steppers, wherein no scanning movement of the substrate takes place, distortion-like imaging aberrations can arise on account of focal length modulations during an exposure time interval if the temporal modulation is not synchronized with the exposure interval. In this case, an average defocus not equal to 0 could result, which can be compensated for in an analogous manner, as already described.

In the wafer steppers and wafer scanners, focus drilling can also be achieved by changing the wavelength within the exposure time interval. If only the bandwidth of the primary radiation is changed statically in this case, generally no effects to be compensated for arise. However, if the focus drilling is effected by altering the wavelength itself, if appropriate without altering the bandwidth, then a temporal modulation of the wavelength leads to a temporal modulation of the defocus and, in principle, the same effects can occur as in the case of focus drilling by means of changing the focal length, and these effects can be correspondingly compensated for.

The invention claimed is:

1. A projection exposure method for the exposure of a radiation-sensitive substrate arranged in the region of an image surface of a projection objective with at least one image of a pattern of a mask arranged in the region of an object surface of the projection objective, the method comprising:

exposing the substrate with the image of the pattern in an effective image field of the projection objective during an exposure time interval;

altering a relative positioning between a surface of the substrate and a focus surface of the projection objective during the exposure time interval in such a way that image points in the effective image field are exposed with different focus positions of the image of the mask during the exposure time interval; and actively compensating at least one portion of at least one imaging aberration induced by the change in the focus positions during the exposure time interval.

2. The projection exposure method of claim 1, wherein the active compensation comprises an alteration of distortion aberrations of the projection objective during the illumination time interval, said alteration being coordinated with the alteration of the relative positioning.

3. The projection exposure method of claim 1, wherein a scanning operation is carried out during the illumination time interval, said scanning operation involving the movement of the mask in the object surface relative to an effective object field and the substrate in the region of the image surface relative to the effective image field of the projection objective synchronously in respective scanning directions.

4. The projection exposure method of claim 3, wherein the substrate is tilted during the exposure time interval relative to the projection objective in a tilting direction, which runs parallel to the scanning direction of the substrate, about a tilting axis in such a way that a substrate normal is inclined by a finite tilting angle with respect to an optical axis of the projection objective in the region of the image plane.

5. The projection exposure method of claim 4, wherein an alteration of the distortion parameters of the projection objective comprises a change in the distortion parallel to the scanning direction of the substrate.

6. The projection exposure method of claim 4, wherein the alteration of the distortion parameters of the projection objective generates a profile of a distortion aberration perpendicular to the scanning direction of the substrate, the profile having a substantially quadratic profile function in a direction perpendicular to the scanning direction.

7. The projection exposure method of claim 1, wherein the active compensation comprises a rigid body movement of at least one optical element relative to other optical elements of the projection objective, the movement comprising a displacement in the direction of the optical axis, a displacement perpendicular to the optical axis and/or a tilting.

8. The projection exposure of claim 1, wherein the active compensation comprises a deformation of at least one optical element.

9. The projection exposure method of claim 1, wherein control signals for driving a manipulator of the projection objective are generated on the basis of predefined values which are stored in a memory of a compensation system in a look-up table.

10. The projection exposure method of claim 1, wherein control signals for driving a manipulator of the projection objective are calculated on the basis of measured values of at least one sensor monitoring the imaging quality of the projection objective.

11. The projection exposure method of claim 10, wherein control signals for driving a manipulator of the projection objective are determined on the basis of information about the extent of the tilting of the substrate.

12. A projection exposure apparatus for the exposure of a radiation-sensitive substrate arranged in the region of an image surface of a projection objective with at least one image of a pattern of a mask arranged in the region of an object surface of the projection objective, comprising:

a primary radiation source for emitting primary radiation;

an illumination system for receiving the primary radiation and for generating an illumination radiation directed onto the mask;

a projection objective for generating an image of the pattern in the region of the image surface of the projection objective;

devices for altering a relative positioning between a surface of the substrate and a focus surface of the projection objective during an exposure time interval in such a way that image points in an effective image field are exposed with different focus positions of the image of the pattern of the mask during the exposure time interval; and a compensation system for the active compensation of at least one portion of at least one imaging aberration induced by the change in the focus positions during the exposure time interval.

13. The projection exposure apparatus of claim 12, wherein the compensation system comprises at least one manipulator for manipulating at least one optical element of the projection objective and a manipulator control unit for controlling the manipulator, the manipulator control unit and the manipulator being configured to obtain an active compensation of at least one portion of at least one imaging aberration induced by the change in the focus position during the exposure time interval.

14. The projection exposure apparatus of claim 13, wherein at least one manipulator is configured as a manipulator for altering distortion aberrations of the projection objective during the illumination time interval.

15. The projection exposure apparatus according of claim 13, wherein at least one manipulator is configured to provide a rigid body movement of at least one optical element relative to other optical elements of the projection objective, the movement comprising a displacement in the direction of the optical axis, a displacement perpendicular to the optical axis and/or a tilting.

16. The projection exposure apparatus of claim 13, wherein at least one manipulator is designed for a defined deformation of an optical element.

17. The projection exposure apparatus of claim 13, wherein control signals for driving a manipulator are generated on the basis of predefined values stored in a memory of the compensation system in the manner of a look-up table.

18. The projection exposure apparatus of claim 13, comprising at least one sensor for detecting distortion aberrations, wavefront aberrations and/or other properties characteristic of the imaging quality of the projection objective, and the manipulator control unit is configured to generate drive signals for driving at least one manipulator from signals of the sensor.

19. The projection exposure apparatus of claim 18, comprising a device for detecting information about the extent of the tilting of the substrate, and the manipulator control unit is configured to generate drive signals for driving at least one manipulator from signals of the sensor.

20. The projection exposure apparatus of claim 12, comprising devices for carrying out a scanning operation involving the movement of the mask in the object surface relative to an effective object field and the substrate in the region of the image surface relative to the effective image field of the projection objective synchronously in respective scanning directions, the projection exposure apparatus further comprising a tilting device for tilting the substrate relative to the projection objective in a tilting direction about a tilting axis in such a way that, during the exposure time interval, a substrate normal is inclined by a finite tilting angle with respect to an optical axis of the projection objective in the region of the image plane.

21. The projection exposure apparatus of claim 20, wherein the manipulator is configured so that an alteration of the distortion parameters of the projection objective comprises a change in the distortion parallel to the scanning direction of the substrate, where the alteration of the distortion parameters of the projection objective provide for generation of a profile of a distortion aberration perpendicular to the scanning direction of the substrate, the profile having a substantially quadratic profile function in a direction perpendicular to the scanning direction.

* * * * *

UNITED STATES PATENT AND TRADEMARK OFFICE
CERTIFICATE OF CORRECTION

PATENT NO. : 7,800,732 B2  Page 1 of 1
APPLICATION NO. : 12/643637
DATED : September 21, 2010
INVENTOR(S) : Joerg Zimmermann It is certified that error appears in the above-identified patent and that said Letters Patent is hereby corrected as shown below:

Column 5, Line 56: After "coherence" delete "a" and insert -- σ --, therefor.

Column 7, Line 26: After "nm" insert -- . --.

Column 9, Line 52: Delete "$Z5=p^2 \cos 2\theta$" and insert -- $Z5=\rho^2 \cos 2\theta$ --, therefor.

Signed and Sealed this

Seventh Day of December, 2010

David J. Kappos
*Director of the United States Patent and Trademark Office*